United States Patent
Chen et al.

(10) Patent No.: US 9,538,676 B2
(45) Date of Patent: Jan. 3, 2017

(54) PROTECTIVE COVER

(71) Applicant: HON HAI PRECISION INDUSTRY CO., LTD., New Taipei (TW)

(72) Inventors: Chien-Hung Chen, New Taipei (TW); Chih-Huang Lien, New Taipei (TW); Hui-Ting Shen, New Taipei (TW); Chien-Yu Tseng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/840,233

(22) Filed: Aug. 31, 2015

(65) Prior Publication Data
US 2016/0234951 A1    Aug. 11, 2016

(51) Int. Cl.
*H05K 5/02* (2006.01)
*H05K 5/03* (2006.01)
*H05K 5/00* (2006.01)
*H01R 12/77* (2011.01)

(52) U.S. Cl.
CPC .............. *H05K 5/03* (2013.01); *H01R 12/771* (2013.01); *H05K 5/0017* (2013.01); *H05K 5/0026* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 5,200,913 A | * | 4/1993 | Hawkins | G06F 1/1615 345/168 |
| 8,200,303 B2 | * | 6/2012 | Morishita | H01Q 1/243 343/893 |
| 2002/0058435 A1 | * | 5/2002 | Williams | G06F 1/1616 439/165 |
| 2003/0221876 A1 | * | 12/2003 | Doczy | G06F 1/1626 178/18.01 |
| 2006/0082518 A1 | * | 4/2006 | Ram | G06F 1/1601 345/1.1 |
| 2006/0112519 A1 | * | 6/2006 | Harmon | G06F 1/1616 16/367 |
| 2007/0105602 A1 | * | 5/2007 | Takebe | H01Q 1/242 455/575.3 |
| 2010/0205777 A1 | * | 8/2010 | Kim | E05D 11/0081 16/386 |

(Continued)

Primary Examiner — Xanthia C Cunningham
(74) Attorney, Agent, or Firm — Zhigang Ma

(57) ABSTRACT

A protective cover includes a first housing configured to receive an electronic device therein, a second housing and a connecting assembly coupling the first housing with the second housing. The connecting assembly includes a first connector assembly including a first connecting shell rotatably coupled to the first housing and a first conducting member capable of coupled to the electronic device, and a second connector assembly including a second connecting shell rotatably coupled to the second housing and two second conducting members electrically coupled to the display screen respectively. When the first conducting member is electrically coupled to one second conducting member, the second housing is capable of rotating relative to the first housing about a first direction. When the second housing is capable of rotating relative to the first housing to a predefined position, the first conducting member is thus electrically coupled to the other second conducting member.

17 Claims, 5 Drawing Sheets

(56) References Cited

U.S. PATENT DOCUMENTS

| | | | | |
|---|---|---|---|---|
| 2010/0271296 | A1* | 10/2010 | Kopychev | A61M 1/14 345/156 |
| 2010/0285836 | A1* | 11/2010 | Horihata | H01Q 1/243 455/552.1 |
| 2010/0285851 | A1* | 11/2010 | Horihata | H01Q 1/243 455/575.3 |
| 2011/0032161 | A1* | 2/2011 | Nakanishi | H01Q 1/2258 343/702 |
| 2011/0057847 | A1* | 3/2011 | Iwai | H01Q 1/243 343/702 |
| 2011/0128194 | A1* | 6/2011 | Sekine | H01Q 9/16 343/702 |
| 2012/0106106 | A1* | 5/2012 | Katou | H04M 1/0216 361/752 |
| 2014/0022741 | A1* | 1/2014 | Rumpler | H05K 7/1468 361/747 |
| 2014/0118897 | A1* | 5/2014 | Chen | F28F 13/14 361/679.01 |
| 2015/0023030 | A1* | 1/2015 | Tsukamoto | G06F 1/1652 362/419 |
| 2015/0277508 | A1* | 10/2015 | McCracken | G06F 1/1626 361/679.3 |
| 2015/0281413 | A1* | 10/2015 | Longo | H04M 1/0212 455/575.3 |
| 2016/0041589 | A1* | 2/2016 | Tazbaz | G06F 1/1637 361/679.06 |

* cited by examiner

PROTECTIVE COVER

FIELD

The subject matter herein generally relates to protective covers, especially to a protective cover with display screen.

BACKGROUND

With development of science and technology, more and more electronic devices have touch screens, and further have protective covers for protecting themselves.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
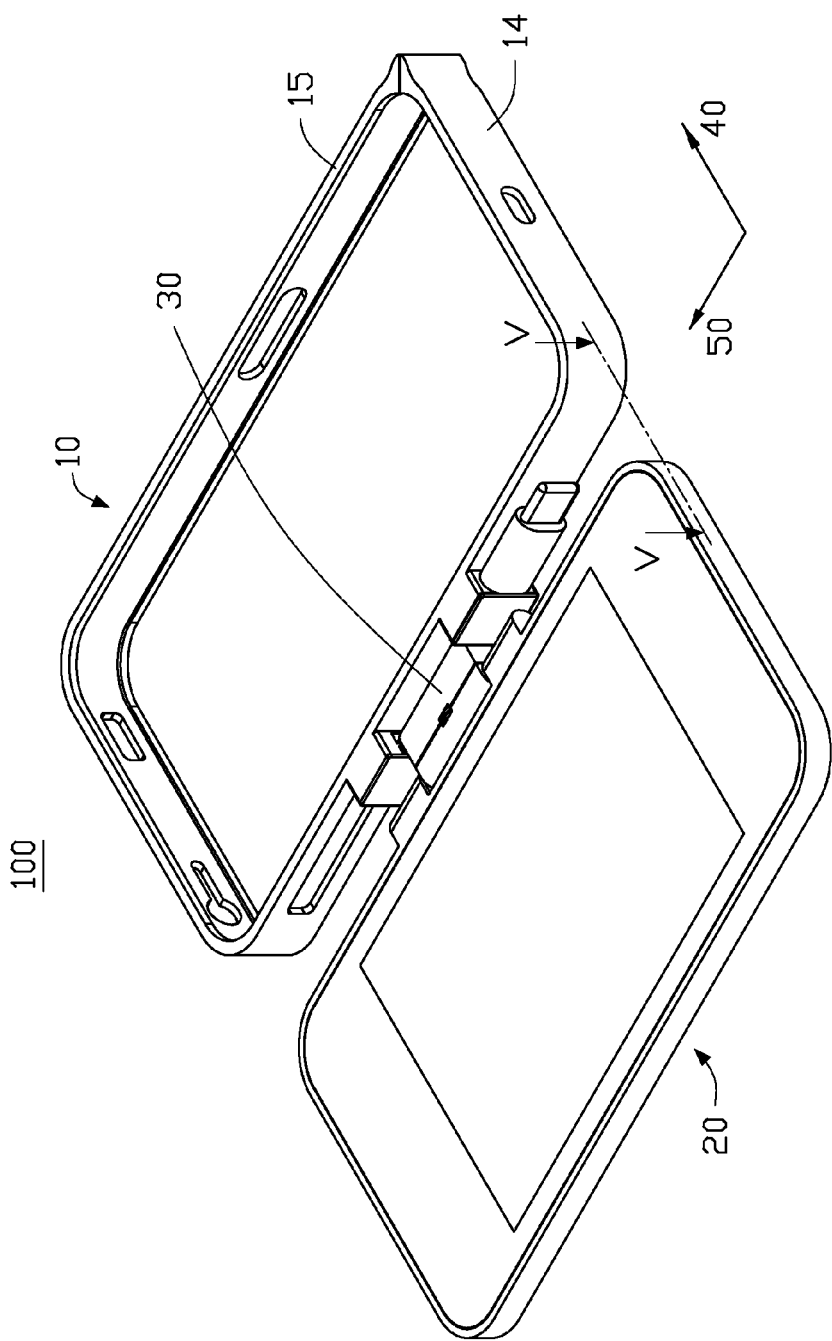
FIG. 1 is an isometric view of an embodiment of a protective cover including a connecting assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 shows a protective cover 100. The protective cover 100 can include a first housing 10, a second housing 20 and a connecting assembly 30 coupling the first housing 10 with the second housing 20.

Figure 2:
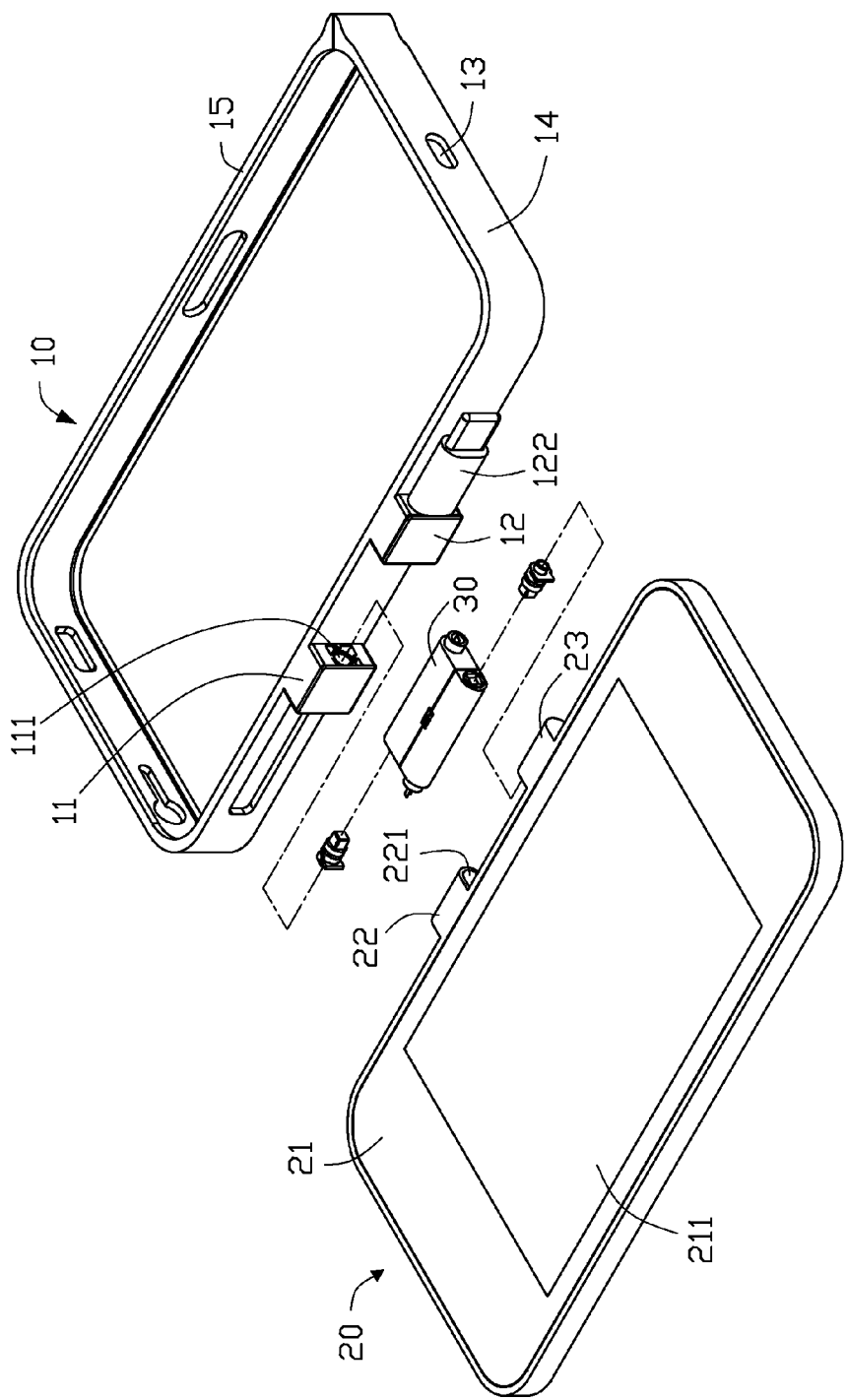
FIG. 2 is a partial exploded isometric view of the embodiment of the protective cover shown in FIG. 1.
Figure 5:
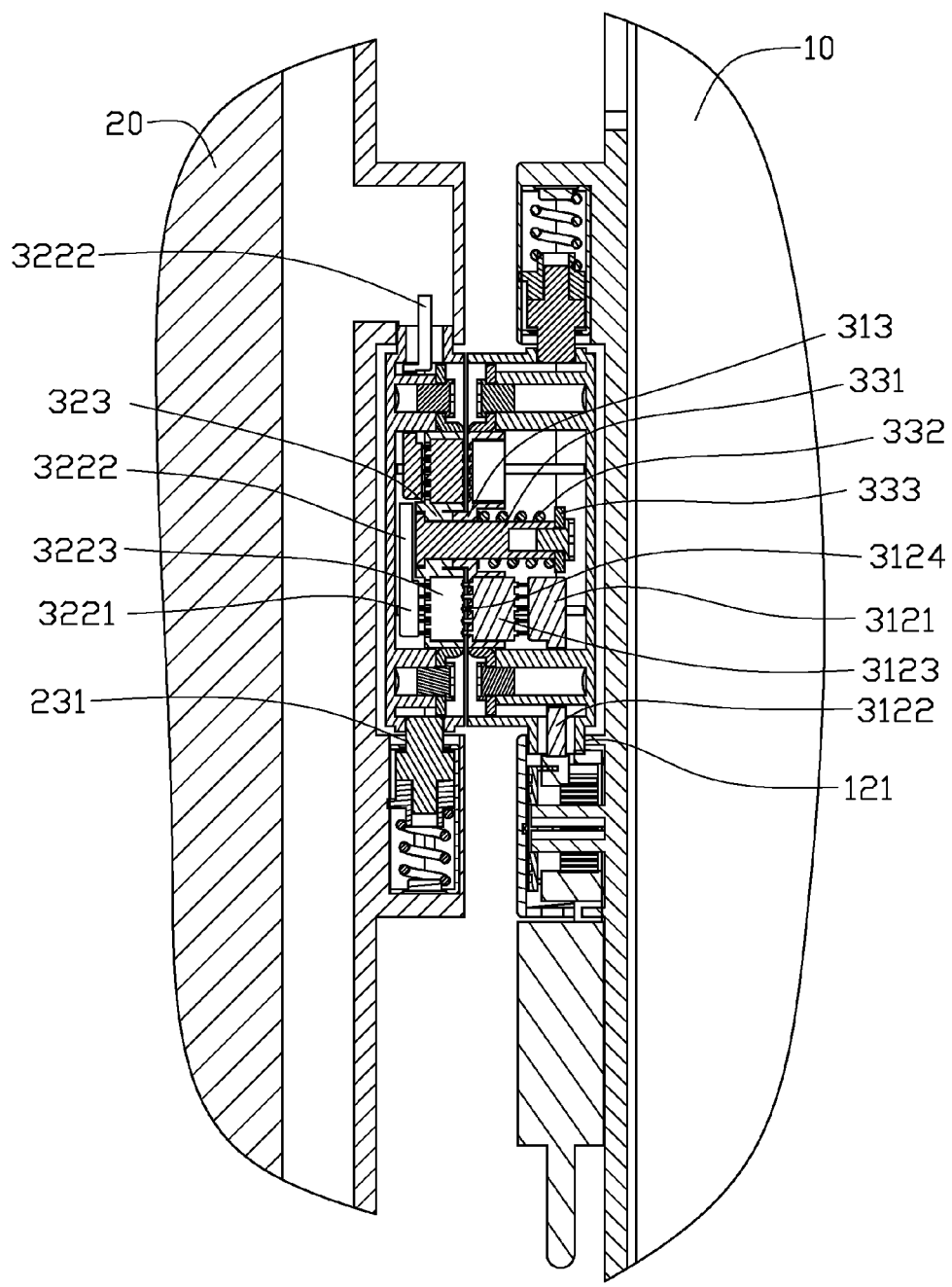
FIG. 5 is a cross-section view of the embodiment of the protective cover taken along line V-V shown in FIG. 1.

The first housing 10 can be rectangular-shaped. The first housing 10 can be used to accommodate an electronic device (not shown), such as a mobile phone, a tablet computer or the like. Referring to FIG. 2, the first housing 10 can include a first connecting block 11 and a second connecting block 12 located at one side of the first housing 10 and opposite to each other. The first connecting block 11 can define a first hole 111 at one side of the first connecting block 11 close to the second connecting block 12. The second connecting block 12 can define a second hole 121 (as shown in FIG. 5) at one side of the second connecting block 12 close to the first connecting block 11. The second connecting block 12 can further include at least one data line (not shown) located therein. Opposite ends of the data line can couple one coupler 122 and the connecting assembly 30 respectively. The coupler 122 can be mounted in other side of the second connecting block 12 away from the first connecting block 11. In at least one embodiment, the coupler 122 can have a structure similar to an elastic tape.

The first housing 10 can define a data interface hole 13 at one end of the first housing 10 corresponding to a data interface (not shown) of the electronic device. The coupler 122 can be pulled out from the second connecting block 12, and pushed to pass through the data interface hole 13 such that the coupler 122 can be inserted into the data interface of the electronic device.

In at least one embodiment, the first housing 10 can further define a volume button hole (not labeled) thereon and a power button hole (not labeled) thereon. The shape and size of the volume button hole and the power button hole can be defined according to need.

The second housing 20 can have a display surface 21. The second housing 20 can include a display screen 211 mounted on the display surface 21. The second housing 20 can include a third connecting block 22 and a fourth connecting block 23 located at one side of the second housing 20 and opposite to each other. The third connecting block 22 can define a third hole 221 at one side of the third connecting block 22 close to the fourth connecting block 23. The fourth connecting block 23 can define a fourth hole 231 (as shown in FIG. 5) at one side of the fourth connecting block 23 close to the third connecting block 22.

Figure 3:
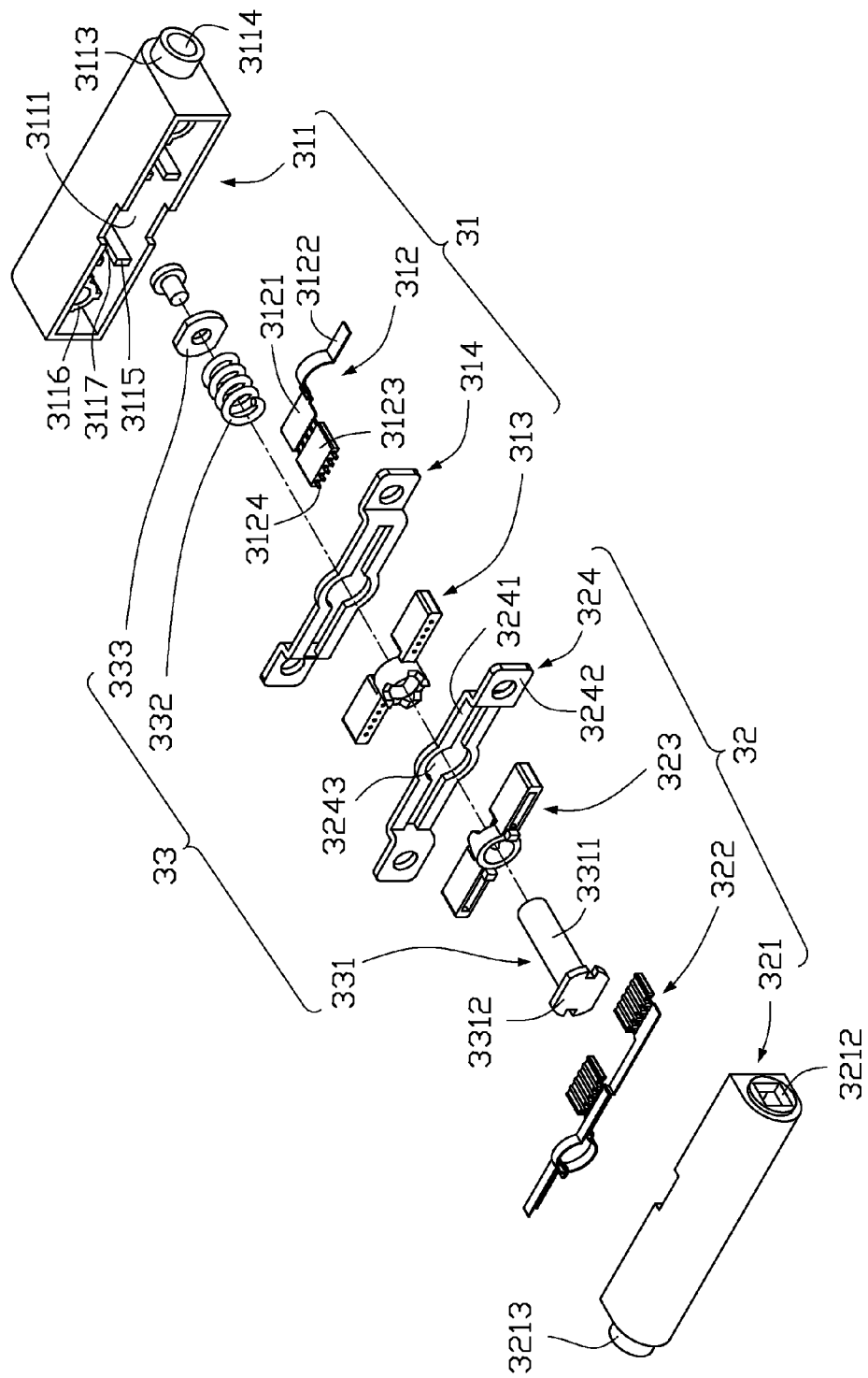
FIG. 3 is an enlarged, exploded isometric view of the embodiment of the connecting assembly shown in FIG. 2.

In at least one embodiment, other configurations of the second housing 20, such as a circuit, are not described here for simplicity Referring to FIG. 3, the connecting assembly 30 can include a first connector assembly 31, a second connector assembly 32, and a fixed assembly 33 configured to fix the first connector assembly 31 to the second connector assembly 32.

The first connector assembly 31 can include a first connecting shell 311, a first conducting member 312 mounted in the first connecting shell 311, a first locking member 313 and a first fixed member 314.

Figure 4:
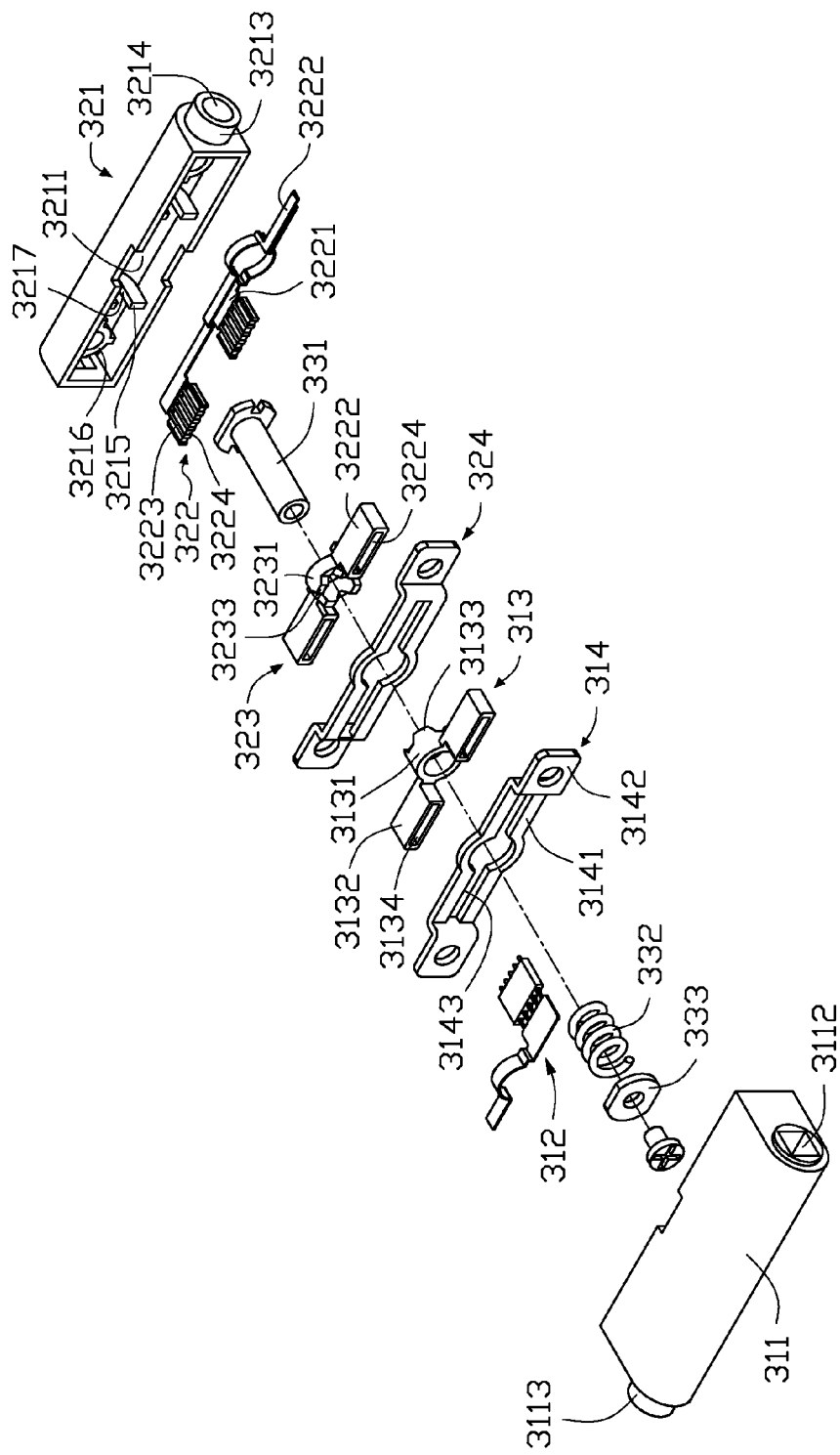
FIG. 4 is similar to FIG. 3, but viewed from another angle.

The first connecting shell 311 can be hollow and rectangular shape. The first connecting shell 311 can define an accommodate space 3111 at one side of first connecting shell 311 facing the second connector assembly 32. Referring to FIG. 4 together, the first connecting shell 311 can define a pivot groove 3112 at one end of the first connecting shell 311 close to the first connecting block 11 and interconnected with the accommodate space 3111. The first connecting shell 311 can further include a protrusion 3113 protruded from other end of the first connecting shell 311 close to the second connecting block 12. The protrusion 3113 can define a through-hole 3114 along an axis of the protrusion 3113 and interconnected with the accommodate space 3111. The first connecting shell 311 can include two aprons 3115 and two bosses 3116. The two aprons 3115 and the two bosses 3116 are both symmetrically located in the accommodate space 3111 respectively. Each apron 3115 can define a notch 3117 located at a substantially middle of the apron 3115. A pivot (not labeled) can pass through the pivot groove 3112 and the first hole 111, and the protrusion 3113 can insert into the second hole 121 such that the first connecting shell 311 can be rotatably coupled to the first housing 10.

In at least one embodiment, the first connecting shell 311 can further include a protrusion (not shown) located at the end of the first connecting shell 311 close to the first connecting block 11.

In this embodiment, the first conducting member 312 can include a circuit board 3121, a flat cable 3122 coupled to the circuit board 3121 and a first connector 3123 coupled to one side of the circuit board 3121 facing the second connector assembly 32. The circuit board 3121 and the flat cable 3122 can be both made of flexible materials. One end of the flat cable 3122 away from the circuit board 3121 can pass through the through hole 3114 from the accommodate space 311 and further coupled to the data line accommodated in the second connecting block 12. The first connector 3123 can be rectangular-shaped. The first connector 3123 can include a number of pins 3124 facing the second connector assembly 32. Referring to FIG. 5 together, the number of pins 3124 can be inserted into the circuit board 3121 such that the first connector 3123 can be electrically coupled to the circuit board 3121.

The first locking member 313 can include a first locking portion 3131 and at least one receiving portion 3132 coupled to the first locking portion 3131. The first locking portion 3131 can be circular-shaped. The first locking portion 3131 can include a number of first protrusions 3133 protruded from one end of the first locking portion 3131 facing the second connector assembly 32. Each two first protrusions 3133 can cooperatively form a groove (not labeled). In this embodiment, the number of the at least one receiving portion 3132 can be two. The two receiving portions 3132 can be located at two opposite sides of the first locking portion 3131. Each receiving portion 3132 can define a receive groove 3134 at one side of the receiving portion 3132 away from the second connector assembly 32. One end of the first connector 3123 away from the circuit board 3121 can receive in the receive groove 3134. The pins 3124 of the first connector 3123 can expose out from one end of the receiving portion 3132 close to the second connector assembly 32. In this embodiment, the receiving portion 3132 can further define a number of through-holes (not labeled) in the receive groove 3134 for the pins 3124 passing through.

In at least one embodiment, the receive groove 3134 can be through the receiving portion 3132 such that the pins 3124 can expose out therefrom.

In at least one embodiment, the number of the at least one receiving portion 3132 can be only one or omitted. When the at least one receiving portion 3132 is omitted, the first conducting member 312 can be fixed to the first connecting shell 311.

The first fixed member 314 can include a main body 3141 and two fixed portions 3142 located at two opposite ends of the main body 3141 respectively. The main body 3141 can define a fix groove 3143 corresponding to the first locking member 313. The first locking member 313 can be inserted into the fix groove 3143 such that the first locking member 313 can be fixed to the first fixed member 314. The first fixed member 314 can be fixed in the first connecting shell 311 via a bolt passing through one of the two fixed portions 3142 and further inserting into one of the two bosses 3116.

In at least one embodiment, the first fixed member 314 can be omitted. The first locking member 313 can be inserted into the two notches 3117. The first locking member 313 can be locked in the first connecting shell 311 via a hook engaging with a buckle. Furthermore, in other embodiments, the first locking member 313 and the first fixed member 314 can be made of same material.

The second connector assembly 32 can include a second connecting shell 321, a second conducing member 322 received in the second connecting shell 321, a second locking member 323 and a second fixed member 324.

The second connecting shell 321 can be hollow and rectangular shape. The second connecting shell 321 can define an accommodate groove 3211 at one side of the second connecting shell 321 facing the first connector assembly 31. The second connecting shell 321 can define a pivot groove 3212 at one end of the second connecting shell 321 close to the fourth connecting block 23. The second connecting shell 321 can include a protrusion 3213 protruded from other end of second connecting shell 321 close to the third connecting block 22. The protrusion 3213 can define a through-hole 3214 along an axis of the protrusion 3213 and interconnected with the accommodate groove 3211. The second connecting shell 321 can include two aprons 3215 and two bosses 3216. The two aprons 3215 and two bosses 3216 can be both symmetrically located in the accommodate groove 3211 respectively. Each apron 3215 can define a notch 3217 at a substantially middle thereof. A pivot (not shown) can pass through the pivot groove 3212 and further insert into the fourth hole 231, and the protrusion 3213 can insert into the third hole 221 such that the second connecting shell 321 can be rotatable coupled to the second housing 20.

In at least one embodiment, the second connecting shell 321 can include a protrusion (not shown) located at the end of the second connecting shell 321 close to the third connecting block 23.

In this embodiment, the number of the second conducting member 322 can be two.

Each second conducting member 322 can include a circuit board 3221, a flat cable 3222 coupled to the circuit board 3221, and a second connector 3223 coupled to one side of the circuit board 3221 facing the first connector assembly 31. The circuit board 3221 and the flat cable 3222 can be both made of flexile materials. One end of the flat cable 3222 away from the circuit board 3221 can pass through the through-hole 3214 from the accommodate groove 3211, and insert into the third hole 221 such that the flat cable 3222 can be electrically coupled to the second housing 20. The second connector 3223 can be substantially rectangular-shaped. The second connector 3223 can include a conducting portion 3224 located at one side of the second connector 3223 away from circuit board 3221. The conducting portion 3224 can correspond to the pins 3124. The pins 3124 can insert into the conducting portion 3224 such that the circuit board 3221 can be electrically coupled to the second connector 3223 and the first conducting member 312 can be electrically coupled to the second conducting member 322.

The second locking member 323 can include a second locking portion 3231 and at least one receiving portion 3232 coupled to the second locking portion 3231. The second locking portion 3231 can be circular-shaped. The second locking portion 3231 can include a number of second protrusions 3233 protruded from one end of the second locking portion 3231 facing the first connector assembly 31 and corresponding to the number of second protrusions 3133. The second protrusions 3233 can engage with the grooves formed by the first protrusions 3133 such that the first locking member 313 can engage with the second locking member 323. The number of the at least one receiving portion 3232 can be two. The two receiving portions 3232 can be located at two opposite sides of the locking portion 3231. Each receiving portion 3232 can define a receive space 3234 at one side of the receiving portion 3232 away from the first connector assembly 31. Each second connector 3223 can receive in one of the two receive space 3234 such that the pins 3124 can insert into the conducting portion 3224 and the first connector assembly 31 can be electrically coupled to the second connector assembly 32.

In at least one embodiment, the receiving portions 3232 can be omitted, and the second conducting member 322 can be thus fixed to the second housing 321.

The second fixed member 324 can include a main body 3241 and two fixed portions 3242 protruded from opposite ends of the main body 3241. The main body 3241 can define a fix groove 3243 corresponding to the second locking member 323. The second locking member 323 can insert into the fix groove 3243 such that the second locking member 323 can be fixed to the second fixed member 324. The second fixed member 324 can be fixed in the second connecting shell 321 via a bolt passing through one of the two fixed portions 3242 and further inserting into one of the two bosses 3216.

In at least one embodiment, the second fixed member 324 can be omitted. The second locking member 323 can insert into the two notches 3217, and be further engaged in the second connecting shell 321 via a hook engaging with a buckle. In other embodiments, the second locking member 323 and the second fixed member 324 can be made of same materials.

The first housing 10 can have a frame 14 along a width direction thereof and a frame 15 along a longitudinal direction thereof. The frame 14 can be substantially perpendicular to the frame 15.

Referring to FIG. 1 again, a first direction 40 and a second direction 50 can be defined. The first direction 40 can be substantially parallel to the frame 15. The second direction 50 can be substantially parallel to the frame 14.

Referring to FIGS. 1, 3 and 4, the fixed assembly 33 can include a fixing member 331, an elastic member 332 and a fixed plate 333.

The fixing member 331 can be T-shaped. The fixing member 331 can include a fixing portion 3311 and an abutting portion 3312 coupled to the fixing portion 3311. The end of the fixing portion 3311 away from the abutting portion 3312 can pass through the second locking portion 3231 and the first locking portion 3131 in sequence. The abutting portion 3312 can thus abut one side of the second locking member 323 away from the first locking member 313.

In this embodiment, the elastic member 332 can be a spring. The elastic member 332 can be sleeved on the fixing portion 3311. The fixed plate 333 can be fixed to one end of the fixing portion 3311 away from the abutting portion 3312. Opposite ends of the elastic member 332 can abut the first locking member 313 and the fixed plate 333 respectively. When the first conducting member 312 is electrically coupled to one of the two second conducting members 332, the second connector assembly 32 can be pulled to move away from the first connector assembly 31 such that the second locking member 323 can disengage from the first locking member 313, and the second housing 20 can be thus capable of rotating relative to the first housing 10 about the second direction 50. When the second connector assembly 32 is moving to a predefined position relative to the first connector assembly 31, that is, the first conducting member 312 is facing the other conducting member 322, an elastic force of the elastic member 332 can enable the first connector assembly 31 to lock with the second connector assembly, and further enable the first conducting member 312 to electrically couple with the other second conducting member 322.

Referring to FIG. 5, when in assembly, the first connector 3123 of the first conducting member 312 can be received in the receive groove 3134, the pins 3124 can be thus exposed out from the end of the receiving portion 3132 away from the first connector 3123, and the first locking member 313 can be thus inserted into the fix groove 3143 such that the first locking member 313 can be fixed to the first fixed member 314. The second connector 3223 of the second conducting member 322 can be received in the receive space 3234 of the second locking member 323, the second locking member 323 can be thus inserted into the fix groove 3243 such that the second locking member 323 can be fixed to the second fixed member 324, and the fixing portion 3311 of the fixing member 331 can pass through the second locking portion 3231 and first locking portion 3131 in sequence, such that the abutting portion 3312 can abut the end of the second locking member 323 away from the first locking member 313. The elastic member 332 can be sleeved on the fixed portion 3311. The fixed plate 333 can be fixed to the fixing portion 3311 such that the opposite ends of the elastic member 332 abut the first locking member 313 and the fixed plate 333 respectively. The first fixed member 314 can be fixed to the first connecting shell 311, and the second fixed member 324 can be fixed to the second connecting shell 321. Lastly, the first connecting shell 311 can be rotatably coupled to the first housing 10, and the second connecting shell 321 can be rotatably coupled to the second housing 20.

When the electronic device is received in the first housing 10, and the display screen 211 of the second housing 20 is needed to use, the coupler 122 can be inserted into the data interface of the electronic device, the first locking member 313 can be locked with the second locking member 323, the first conducting member 312 can be electronically coupled to the second conducting member 322, the second housing 20 can be caused to rotate relative to the first housing 10 about the first direction 40, and the display screen 211 can be always electrically coupled to the electronic device when the second housing 20 is rotating relative to the first housing.

The second housing 20 can be pulled to move away from the first housing such that the second locking member 323 can be capable of disengaging from the first locking member 313, and the second housing 20 can be caused to rotate relative to the first housing 10 about the second direction 50, and the second locking member 323 can be capable of engaging with the first locking member 313 again and the first conducting member 312 can be electrically coupled to the other conducting member 322, such that the display screen can be electrically coupled to the electronic device again.

In at least one embodiment, the elastic member 332 can be omitted, the first locking member 313 can be engaged or disengaged with the second locking member 323 via manual operation.

In at least one embodiment, the first locking member 313 can be engaged with the second locking member 323 via but not limited to first protrusions 3144 engaging the second protrusions 3244. The first locking member 313 can be inserted into the second locking member 323.

In at least one embodiment, the fixed assembly 33 can be omitted. The first connector assembly 31 can be coupled to the second connector assembly 32 via the first conducting member 312 inserting into one of the two second conducting member 322, or the first conducting member 3132 inserting into the other second conducting member 322.

In at least one embodiment, the first connector 3123 can be omitted. The pins 3124 of the first conducting member 312 can be electrically inserted into the conducting portion 3224 of the second conducting member 322, such that the first conducing member 312 can be electrically coupled to the second conducting member 322.

In at least one embodiment, the circuit board 3121 of the first conducting member 312 and the circuit board 3221 of the second conducting member 322 can be omitted, the flat cable 3122 can be electrically coupled to the first connector 3123, and the flat cable 3222 can be electrically coupled to the second connector 3223.

The embodiments shown and described above are only examples. Many details are often found in the art such as the other features of protective cover. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A protective cover comprising:
a first housing, the first housing configured to receive an electronic device therein;
a second housing, the second housing having a display screen; and
a connecting assembly coupling the first housing with the second housing; the connecting assembly comprising:
a first connector assembly comprising:
a first connecting shell rotatably coupled to the first housing;
a first locking member mounted in the first connecting shell; and
a first conducting member, the first conducting member couplable to the electronic device; and
a second connector assembly comprising:
a second connecting shell rotatably coupled to the second housing;
a second locking member mounted in the second connecting shell; and
two second conducting members, the two second conducting members electrically coupled to the display screen,
wherein the first conducting member is electrically coupled to one of the two second conducting members, and the second housing is capable of rotating relative to the first housing about a first direction when the first locking member is engaged with the second locking member;
the second locking member is capable of rotating relative to the first locking member along a second direction perpendicular to the first direction when the first locking member is disengaged from the second locking member, and the first conducting member is not electrically coupled to the one of the two second conducting members, such that the first locking member is engaged with the second locking member again, and the first conducting member is electrically coupled to the other of the two second conducting members, thereby causing the first conducting member to electrically couple with the display screen.

2. The protective cover of claim 1, wherein the first conducting member comprises a first connector, the first connector comprises pins facing the second connector assembly, each second conducting member comprises a second connector, each second connector comprises a conducting portion, the pins receive in the conducting portion such that the first conducting member is electrically coupled to the display screen.

3. The protective cover of claim 2, wherein the first conducting member further comprises a circuit board and a flat cable coupled to the circuit board, the first connector is coupled to one side of the circuit board facing the second connector assembly.

4. The protective cover of claim 2, wherein each second conducting member further comprises a circuit board, and a flat cable coupled to the circuit board, and the second connector is coupled to one side of the circuit board facing the first connector assembly.

5. The protective cover of claim 2, wherein the first locking member comprises a first locking portion and at least one receiving portion coupled to the first locking portion, each receiving portion defines a receive groove, the first connector is received in the receive groove, and the pins expose out from the receive groove.

6. The protective cover of claim 2, wherein the second locking member comprises a second locking portion and two receiving portions opposite to each other and coupled to the second locking portion, each receiving portion defines a receive space, each second connector is received in one of the two receive spaces.

7. The protective cover of claim 2, wherein the first locking member comprises a first locking portion, the first locking portion comprises a number of first protrusions protruded from one end of the first locking portion facing the second connector assembly, the second locking member comprises a second locking portion, the second locking portion comprises a number of second protrusions protruded from one end of the locking portion facing the first connector assembly and corresponding to the number of first protrusions, each first protrusion is received in a groove formed by two adjacent second protrusions such that the first locking member engages with the second locking member.

8. The protective cover of claim 1, wherein the first connector assembly further comprises a first fixed member, the first fixed member comprises a main body, the main body defines a fix groove corresponding to the first locking member, the first locking member is inserted into the fix groove such that the first locking member is fixed to the first fixed member.

9. The protective cover of claim 8, wherein the first fixed member further comprises two fixed portions located at two opposite ends of the main body respectively, the first connecting shell comprises two bosses symmetrically located therein, each fixed portion is fixed to one of the two bosses such that the first fixed member is fixed in the first connecting shell.

10. The protective cover of claim 1, wherein the second connector assembly further comprises a second fixed member, the second fixed member comprises a main body, the main body defines a fix groove corresponding to the second locking member, the second locking member inserts into the fix groove such that the second locking member is fixed to the second fixed member.

11. The protective cover of claim 10, wherein the second fixed member further comprises two fixed portions protruded from opposite ends of the main body respectively, the second connecting shell comprises two bosses symmetrically located therein, each second fixed portion is fixed to one of the two bosses such that the second fixed member is fixed to the second connecting shell.

12. The protective cover of claim 1, wherein the connecting assembly further comprises a fixed assembly, the fixed assembly comprises a fixing member and a fixed plate, the fixing member comprises a fixing portion and an abutting portion coupled to the fixing portion, the fixing portion passes through the first second locking member and the first locking member in sequence, the abutting portion abuts the second locking member, the fixed plate is fixed to the fixing portion and abuts the first locking member.

13. The protective cover of claim 12, wherein the fixed assembly further comprises an elastic member, the elastic member is sleeved on the fixing portion, and abuts between the first locking member and the fixed plate.

14. The protective cover of claim 1, wherein the first housing comprises a first connecting block and a second connecting block located at one side of the first housing and opposite to each other, the first connecting block defines a first hole at one side of the first connecting block close to the second connecting block, the second connecting block defines a second hole at one side of the second connecting block close to the first connecting block; the first connecting shell defines a pivot groove at one end of the first connecting shell close to the first connecting block and comprises a protrusion protruded from other end of the first connecting shell close to the second connecting block; the pivot groove and the first hole are coupled via a pivot, the protrusion inserts into the second hole, such that the first connector assembly is rotatably coupled to the first housing.

15. The protective cover of claim 14, wherein the first connecting shell defines an accommodate space facing the second connector assembly, the protrusion defines a through-hole along an axis of the protrusion and interconnected with the accommodate space, the first conducting member comprises a flat cable, the flat cable passes through the through-hole from the accommodate space and electrically couples with the electronic device.

16. The protective cover of claim 1, wherein the second housing comprises a third connecting block and a fourth connecting block located at one side of the second housing and opposite to each other, the third connecting block defines a third hole at one side of the third connecting block close to the fourth connecting block, the fourth connecting block defines a fourth hole at one side of the fourth connecting block close to the third connecting block; the second connecting shell defines a pivot groove at one end of the second connecting shell close to the fourth connecting block and comprises a protrusion protruded from other end of the second connecting shell close to the third connecting block; the pivot groove and the third hole are coupled via a pivot, the protrusion inserts into the fourth hole, such that the second connector assembly is rotatably coupled to the second housing.

17. The protective cover of claim 16, wherein the second connecting shell defines an accommodate groove facing the first connector assembly, the protrusion defines a through-hole along an axis of the protrusion and interconnected with the accommodate groove, the second conducting member comprises a flat cable, the flat cable passes through the through-hole from the accommodate groove and electrically coupled with the display screen.

* * * * *